United States Patent
Wu et al.

(10) Patent No.: US 10,102,081 B2
(45) Date of Patent: Oct. 16, 2018

(54) MEMORY CONTROLLER SYSTEM WITH NON-VOLATILE BACKUP STORAGE

(71) Applicant: Rambus Inc., Sunnyvale, CA (US)

(72) Inventors: Shih-ho Wu, Thousand Oaks, CA (US); Christopher Haywood, Thousand Oaks, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/401,985

(22) Filed: Jan. 9, 2017

(65) Prior Publication Data

US 2017/0185489 A1 Jun. 29, 2017

Related U.S. Application Data

(63) Continuation of application No. 15/137,467, filed on Apr. 25, 2016, now Pat. No. 9,575,686, which is a continuation of application No. 14/316,707, filed on Jun. 26, 2014, now Pat. No. 9,348,705.

(51) Int. Cl.
| | | |
|---|---|---|
| *G06F 11/14* | (2006.01) | |
| *G11C 14/00* | (2006.01) | |
| *G06F 3/06* | (2006.01) | |
| *G06F 11/16* | (2006.01) | |

(52) U.S. Cl.
CPC ........ *G06F 11/1458* (2013.01); *G06F 3/0619* (2013.01); *G06F 3/0647* (2013.01); *G06F 3/0683* (2013.01); *G06F 11/1666* (2013.01); *G11C 14/0009* (2013.01); *G06F 2201/83* (2013.01)

(58) Field of Classification Search
CPC .. G06F 11/1458; G06F 3/0619; G06F 3/0647; G06F 3/0683; G06F 11/1666; G11C 14/0009
See application file for complete search history.

(56) References Cited

U.S. PATENT DOCUMENTS

| | | | |
|---|---|---|---|
| 7,392,429 B2 | 6/2008 | Frank et al. | |
| 8,325,554 B2 * | 12/2012 | Sweere | G06F 12/0866 365/185.08 |
| 2008/0269918 A1 * | 10/2008 | Piacibello | G06F 8/60 700/21 |
| 2012/0198312 A1 * | 8/2012 | Kankani | G06F 11/1012 714/768 |
| 2013/0205065 A1 | 8/2013 | Kloeppner et al. | |
| 2015/0066819 A1 | 3/2015 | Mozak et al. | |

* cited by examiner

*Primary Examiner* — Eric Cardwell
(74) *Attorney, Agent, or Firm* — Lowenstein Sandler LLP

(57) ABSTRACT

The present invention is directed to computer storage systems and methods thereof. More specifically, embodiments of the present invention provide an isolated storage control system that includes both a non-volatile memory and a volatile memory. The non-volatile memory comprises a data area and a metadata area. In power failure or similar situations, content of the volatile memory is copied to the data area of the non-volatile memory, and various system parameters are stored at the metadata area. When the system restores its operation, the information at the metadata area is processed, and the content stored at the data area of the non-volatile memory is copied to the volatile memory. There are other embodiments as well.

20 Claims, 5 Drawing Sheets

MEMORY CONTROLLER SYSTEM WITH NON-VOLATILE BACKUP STORAGE

CROSS-REFERENCES TO RELATED APPLICATIONS

The present application is a continuation of and claims priority to U.S. patent application Ser. No. 15/137,467 filed Apr. 25, 2016, which is a continuation of and claims priority to U.S. patent application Ser. No. 14/316,707 filed Jun. 26, 2014, which are incorporated by reference in their entirety herein for all purposes.

BACKGROUND OF THE INVENTION

The present invention is directed to computer storage systems and methods thereof.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily, and that number is growing. With such high demands on data and data transfer, existing data communication systems need to be improved to address these needs. Companies built large server farms, where large numbers of computers together provide computational power to remote clients. Speed and reliability are two important aspects of server computers. For example, servers often has mechanism for data backup in situations such as power failure.

Over the past, conventional techniques have been proposed to improve computer reliability. Unfortunately, these conventional techniques inadequate, as explained below. Therefore, improved system and methods for data reliability are desired.

BRIEF SUMMARY OF THE INVENTION

The present invention is directed to computer storage systems and methods thereof. More specifically, embodiments of the present invention provide an isolated storage control system that includes both a non-volatile memory and a volatile memory. The non-volatile memory comprises a data area and a metadata area. In power failure or similar situations, content of the volatile memory is copied to the data area of the non-volatile memory, and various system parameters are stored at the metadata area. When the system restores its operation, the information at the metadata area is processed, and the content stored at the data area of the non-volatile memory is copied to the volatile memory. There are other embodiments as well.

According to an embodiment, the present invention provides a memory system that includes a non-volatile memory, which includes a data area and a metadata area. The metadata area is predefined to store system parameters. The system also includes a volatile memory. The system includes a backup power module. The system additionally includes a controller module, which has a host interface and a plurality of registers. The controller module is configured to transferring data received from the host interface to the volatile memory. In a SAVE event, the controller module is configured to cause the non-volatile memory to store at least content of the plurality of registers and signature data at the metadata area and store content of the volatile memory at the data area. In a RESTORE event, the controller module is configured to determine a validity of the content stored at the data area using at least the signature data, and the controller module causes the content stored at the data area to be copied to the volatile memory if the content at the data area is determined to be valid.

a method for preserving volatile memory data for a memory system. The method includes defining a data area and a metadata area on a non-volatile memory. The method also includes detecting a failure event. The method includes allocating at least a portion of the data area for storing a content of a volatile memory. The method includes storing a location of the portion of the data area at the metadata area. The method further includes storing operating parameters of the memory system at the metadata area. The operating parameters include information related to characteristics of the volatile memory. The method further includes storing the content of the volatile memory at the portion of the data area. The method additionally includes updating one or more signature data stored at the metadata area.

According to another embodiment, the present invention provides a method for restoring operation and data for a memory system. The method includes obtaining a signature data stored at a metadata area of a non-volatile memory, which includes a metadata area and a data area. The method further includes comparing the signature data to a reference data to determine whether a previous backup event is valid. If the backup event is valid, the following steps are performed:
  obtaining operating parameters from the metadata area;
  operating a controller module in accordance with the operating parameters;
  copying a first content stored at the data area to a volatile memory.
  On the other hand, if the backup event is invalid, the following steps are performed:
  initializing the metadata area using at least a predetermine set of parameters;
  initializing the memory system.

It is to be appreciated that embodiments of the present invention provides numerous advantages over existing technologies. Among other things, by storing both operating parameters of the memory system controllers and content of the volatile memory, back and restore operations can be performed reliability and efficiently. In addition, the memory systems according to embodiments of the present invention can be implemented and readily utilized by existing systems. For example, from host system perspective, a memory system according to embodiments of the present invention operates much like an existing volatile memory, with the added benefit of providing backup functionality without additional inputs from the memory host system. There are other embodiments as well.

DETAILED DESCRIPTION OF THE INVENTION

Figure 1:
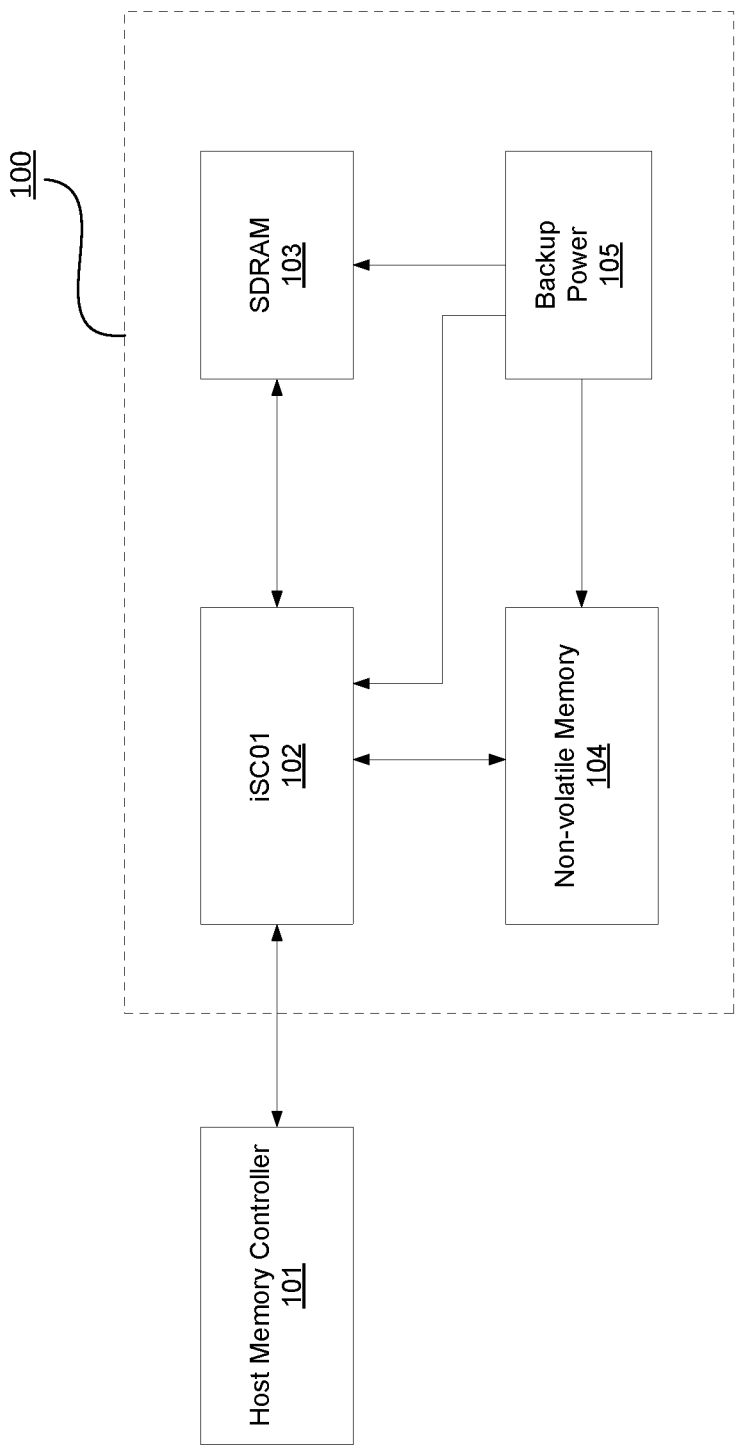
FIG. 1 is a simplified diagram illustrating an iSC controller system according to an embodiment of the present invention.

The present invention is directed to computer storage systems and methods thereof. More specifically, embodiments of the present invention provide an isolated storage control system that includes both a non-volatile memory and a volatile memory. The non-volatile memory comprises a data area and a metadata area. In power failure or similar situations, content of the volatile memory is copied to the data area of the non-volatile memory, and various system parameters are stored at the metadata area. When the system restores its operation, the information at the metadata area is processed, and the content stored at the data area of the non-volatile memory is copied to the volatile memory. There are other embodiments as well.

As explained above, providing reliability is an important aspect of data servers and other applications. For example, power failure is a common scenario where unsaved information is lost. When information is stored in non-volatile memory, the amount of data loss is often small, and sometimes negligible. With server applications, where large amount of data, if not all the data, is stored in volatile memory (e.g., RAM) for speed, data loss can be catastrophic in the event of power or system failure.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Embodiments of the present invention provides an isolation storage controller (iSC) system that includes a non-volatile DIMM memory (NVDIMM) that includes both volatile memory and non-volatile memory, where the non-volatile memory is specifically configured to preserve information stored at the volatile memory in the event of power or other types of failures. The iSC system is capable of selectively backup and restore the content of the volatile memory, and to determine the integrity of the information stored at the non-volatile memory. For example, non-volatile memory is implemented using flash memory and volatile memory is implemented using SDRAM, but it is to be understood that other types of components may be used as well.

FIG. 1 is a simplified diagram illustrating an iSC controller system according to an embodiments of the present invention. This diagram is merely an example, which should not unduly limit the scope of the claims. One of ordinary skill in the art would recognize many variations, alternatives, and modifications. As shown in FIG. 1, an iSC system 100 is connected to the host memory controller 101. For example, the host memory controller 101 uses the iSC system 100 as a non-volatile DIMM (NVDIMM) module that is capable of preserving data in failure scenarios. The iSC system 100 includes a controller module iSC01 102, a volatile memory 103 (e.g., SDRAM), a non-volatile memory 104 (e.g., flash memory, SSD, etc.), and a backup power 105.

The controller module 102 is connected to other modules of the iSC system 100 via its interfaces. The controller module iSC01 102 comprises a host Interface, an SDRAM interface, and a non-volatile memory interface. In various implementations, the host interface of the controller module 102 connects to system memory host controller 101 through a DIMM edge connector. Depending on the application, other connections between the host interface and the host memory controller 101 can be used as well. The SDRAM interface of the controller module 102 connects to SDRAM 103. For example, the SDRAM 103 may include a number of memory modules, and the controller module 102 can be connected to the SDRAM 103 via various types of bus lines. For example, the host interface and SDRAM interface of the controller module perform load-reduction memory buffer (MB) operation. Also, other types of volatile memory device can be used as well.

The non-volatile memory interface connects the controller module 102 to a non-volatile memory 104. Non-volatile memory 104 can be implemented using various types of devices, such as flash memory, solid state disk, and/or others. The non-volatile memory 104 is shown as a part of the iSC system 100, but it can be implemented using external storage devices. For example, the non-volatile memory 104 can be a part of the server storage and external to the iSC system 100.

In a specific embodiment, the non-volatile memory 104 has a capacity greater than the volatile memory module 103 and is thus able to preserve the entirety of information stored at the volatile memory module 103. The interface between the controller module 102 and the non-volatile memory 104 is high-speed and low-latency. In a specific embodiment, a SATA interface, which can provide a bandwidth of 6 Gbps, is used to implement the non-volatile memory interface of the controller module 102. For example, the SATA interface is used to preserve SDRAM content (e.g., backup image) during a system power failure situation. The non-volatile memory interface of the controller module 102 can be implemented using other types of bus interfaces as well, such as PCI Express, and others.

As shown in FIG. 1, the controller module 102 is electrically coupled to a power backup 105. Depending on the application, the backup power 105 may store enough power for sustaining the iSC system 100 through short power failure. In certain embodiments, the backup power 105 has enough power to allow data stored at the volatile memory 103 to be saved to the non-volatile memory 104. In various embodiments, the backup power 105 is constantly recharged.

In addition to power failures, there can be different types of situations or events that trigger backing up the content stored at the volatile memory to the non-volatile memory. For example, the backing up process is triggered by a predetermined "SAVE" event. When a SAVE event trigger (e.g., due to system power failure or software initiated) is received, the controller module 102 performs SDRAM reads and saves SDRAM content to the non-volatile memory 104 through its non-volatile memory interface. Since the non-volatile memory 104 retains data without power, the volatile memory content is preserved even when the system completely loses power. For example, the backup power 105 of the iSC system 100 can be implemented as a temporary power source, such as a super capacitor. The backup power 105 supplies the power needed for the SAVE operation. Once the SAVE operation is complete the backup power is no longer needed.

It is to be appreciated that the non-volatile memory 104, operating in conjunction with the controller module 102, is configured to store contents of the volatile memory 103 and system settings and parameters. In a specific embodiment, the non-volatile memory 104 has a storage capacity that is multiple size of the volatile memory 103, and thus is capable of storing more than one instance of the volatile memory content.

The content stored at the non-volatile memory can be restored back to the volatile memory. In various embodiments, after system power is restored, a "RESTORE" event trigger is sent to the controller module 102. The RESTORE operation restores volatile memory content using the saved image stored at the non-volatile memory through the volatile and non-volatile interfaces of the controller module 102. For example, the SAVE and RESTORE operation performed by the iSC system 100 does not need participation from the host system (e.g., host memory controller 101). From system perspective, the content of the volatile memory is intact and the non-volatile memory appears to be non-volatile. In addition, system parameters and/or settings may be loaded from the non-volatile memory during the RESTORE operation.

It is desirable and sometimes necessary to have system or chip configuration parameters preserved over a loss of power to the system or chip. One such example is the CMOS RAM in a traditional PC design. It contains critical configuration parameters for system boot. Its content is preserved by a small button or rechargeable battery so it remains persistent over a power loss event.

The SAVE and RESTORE operations described above are a simplification. For reliability purposes, many things happen when data are transferred between the non-volatile memory 104 and the volatile memory 104. When the non-volatile memory 104 saves the content of volatile memory 103, the controller module 102 also saves relevant system information and configuration parameters to the metadata field of the non-volatile memory 104. When the controller module 102 retrieves information from the non-volatile memory 104 to restore the volatile memory, the controller module 102 first processes the information stored at the metadata field of the non-volatile memory 104.

It is to be appreciated that the preservation of configuration parameters and system information over a power loss event is important to the operation of the controller module 102 and the iSC system 100 as a whole. The SAVE and RESTORE operations are to be performed autonomously while the system host controller (e.g., host memory controller 101) may have lost its power and/or is not yet operational. To accomplish this, the iSC system 100 uses a metadata scheme that does not require battery backup.

The controller module 102 manages the non-volatile memory 104 and reserves a predetermined number of data blocks (e.g., 512-byte sectors) in the metadata area of the non-volatile memory 104. According to various implementations, the metadata area is hidden and not accessible for user data (e.g., content of volatile memory 103, or SDRAM images) storage. Typically, critical volatile memory parameters (e.g., latencies, frequencies, organization, etc.) and important control and status data are saved to the metadata area of the non-volatile memory 104. In contrast, these parameters are typically stored in the chip registers of conventional systems. For example, the metadata area is updated with various system and volatile memory parameters during system initialization, at the beginning and the end of a SAVE or RESTORE operation, or when power loss is detected.

To provide an example, after a power-on reset, the controller module 102 establishes communication with the non-volatile memory 104 and searches for valid metadata. If valid metadata is found, the controller module 102 restores its corresponding internal registers with the metadata content. It is to be appreciated that these registers of the controller module 102 are effectively persistent, as their content survives power loss events.

As explained above, the system 1 operates as an NVDIMM. Instead of the isolated controller implementation illustrated in FIG. 1, other implementations as possible as well, according to existing techniques. For example, field-programmable gate array (FPGA) can be used in implementing NVDIMM systems. It is to be appreciated that embodiments of the present invention offer numerous advantages over existing FPGA based implementations. For example, since an FPGA does not have an integrated memory buffer of isolated controller, FPGA based implementations rely on switches to share the command/address and data buses with the host controller and C/A (command/address) buffer. Existing FPGA implementations also require additional program flash for the FPGA itself. As a result, FPGA based implementations, in comparison to isolated controllers according to embodiments of the present invention, have higher number of components, consume more power, and take up more real estate on a space limited NVDIMM.

Additionally, NVDIMM systems implemented according to embodiments of the present invention provides performance advantages over FPGA based NVDIMM systems. In FPGA implementations, insertion of switches in the high speed command/address and data paths causes degradation of signal integratity, which consequently limits the maximum memory speeds (or frequency) that they can operate. As an example, for DDR3 NVDIMM the FPGA-based NVDIMM speeds is limited to DDR3-1333 or lower. In contrast, isolated controller based NVDIMM systems according embodiments of the present invention can run at maximum speed of DDR3-1866, represents a 40% performance advantage over the FPGA-based implementation in system memory access. There are other benefits as well.

Figure 2:
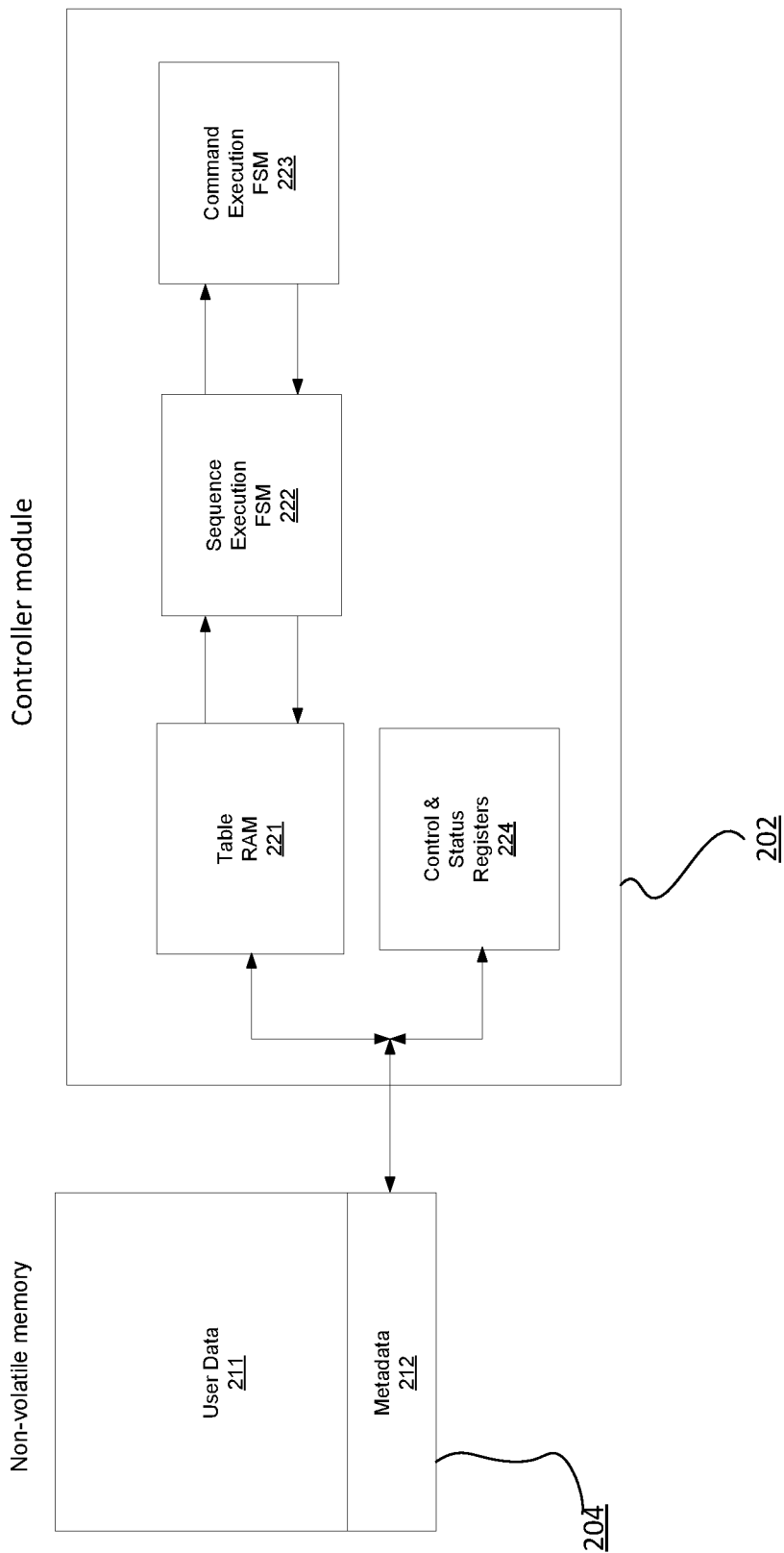
FIG. 2 is a simplified diagram illustrating operation of a controller module data path according to an embodiment of the present invention.

FIG. 2 is a simplified diagram illustrating operation of a controller module data path according to an embodiment of the present invention. This diagram is merely an example, which should not unduly limit the scope of the claims. One of ordinary skill in the art would recognize many variations, alternatives, and modifications. As shown in FIG. 2, the controller module 202 interfaces with the non-volatile memory 204. For example, the controller module 202 may be implemented using the controller module 102 in FIG. 1; the non-volatile module 204 may be implemented using the non-volatile memory 104 in FIG. 1.

As shown in FIG. 2, the non-volatile memory 204 comprises a user data area 211 and a metadata area 212. The metadata area 212 is predefined with data fields for storing various parameters related to components (e.g., controller module, volatile memory, etc.) of the iSC system. The user data 211 is configured to store one or more instances of volatile memory content. As explained above, the non-volatile memory 204 may be implemented using an external storage, and may thus store other information.

The controller module 202, as shown in FIG. 2, includes a table RAM 221, sequence execution finite state machine (FSM) 222, command execution FSM 223, and a registers 224. The operation of the controller module 202 is executed by the command execution FSM 223. Operation parameters and states of the FSMs of the controller module 202 are stored at the registers 224 and continuously updated as the controller module 202 operates. In power failure or similar situations, the controller module 202 sends the content of the registers 224 and other relevant information to the non-volatile memory 204, and non-volatile memory 204 stores them in the metadata area 212.

It is to be appreciated that the content of the metadata area 212 helps restore functionalities of the iSC system. For example, the controller module 202 uses the metadata area 212 to backup register values and various parameters needed to resume operation. In addition, as explained below, the metadata area has data blocks for checking validity of the content stored at the data area 211 and the metadata area 212. According to various implementations, the metadata area 212 includes information from both the table ram 221 and the registers 214.

Table 1 below shows the content stored at the metadata area according to an implementation. It is to be appreciated the metadata content may be implemented in other ways as well.

TABLE 1

| Name | Offset | Description |
| --- | --- | --- |
| Signature Low | 'h0000 | Lower 16 bits of the NV Signature register |
| Signature High | 'h0002 | Upper 16 bits of the NV Signature register |
| NV Status 0 | 'h0004 | 16-bit NV Status 0 register value |
| Brownout Count | 'h0006 | 16-bit Brownout Count register value |
| Start Address | 'h0008 | 16-bit Start Address register value |
| End Address | 'h000A | 16-bit End Address register value |

TABLE 1-continued

| Name | Offset | Description |
| --- | --- | --- |
| LBA0 Low | 'h000C | 16-bit LBA0 Low register value |
| LBA0 Mid | 'h000E | 16-bit LBA0 Mid register value |
| LBA0 High | 'h0010 | 16-bit LBA0 High register value |
| LBA1 Low | 'h0012 | 16-bit LBA1 Low register value |
| LBA1 Mid | 'h0014 | 16-bit LBA1 Mid register value |
| LBA1 High | 'h0016 | 16-bit LBA1 High register value |
| Scratchpad0 | 'h0018 | 16-bit Scratchpad0 register value |
| Scratchpad1 | 'h001A | 16-bit Scratchpad1 register value |
| NV Debug 0 | 'h001C | 16-bit NV Debug 0 register value |
| NV Debug 1 | 'h001E | 16-bit NV Debug 1 register value |
| NV Debug 2 | 'h0020 | 16-bit NV Debug 2 register value |
| SDRAM control | 'h0022-003F | SDRAM parameters such as latencies, frequencies, and organization |
| Context 1 Training | 'h0040-006F | SDRAM training parameters for context 1 |
| Context 2 Training | 'h0070-009F | SDRAM training parameters for context 2 |
| Context 3 Training | 'h00A0-00CF | SDRAM training parameters for context 3 |
| Context 4 Training | 'h00D0-00FF | SDRAM training parameters for context 4 |
| Table RAM | 'h0100-02FF | Operation and command table data. |

As shown in Table 1, the content includes status, count, address, and management data. The "Signature Low" and "Signature High" data are used to validate metadata. For example, the metadata area and the use thereof provide a fail-safe mechanism for status register. Additionally, the metadata area, as defined in Table 1, can store debugging information. Among other things, saving the content of debug registers in the metadata provides a benefit of making debug and workaround settings sticky, and therefore the settings do not need to be re-applied after power cycle or chip reset. Similar benefits apply to the control and address registers.

In an implementation, two 16-bit registers are used to form a 32-bit NV Signature register. The Signature value in this register is stored as a part of the metadata saved after a successful SAVE or RESTORE operation. In a power-on reset operation, the Signature value is retrieved from metadata area of the non-volatile memory and is compared to a hardwired value to determine if the metadata is valid. If the Signature (and hence the metadata) is valid, the controller module loads the metadata into its internal control and status registers to restore the configuration for future SAVE and RESTORE operations. If the Signature is not valid, the controller module initializes the SSD/Flash memory and writes metadata to it. For example, writing a value different from the hardwired value to the NV Signature register causes the next signature comparison to fail and render stored metadata invalid.

The information stored at the metadata area also facilitates selective storage of volatile memory content. The "Start Address" and "End Address" data are pointers defining the location where the content of volatile memory is stored. Depending on the implementation, the data area of the non-volatile memory may store only a portion of the volatile memory content or multiple instance of the volatile memory content (e.g., providing capability to restoring to earlier states), and the "Start Address" and "End Address" allocate the storage space for these data.

Since multiple instances of the volatile memory content may be stored, more than one sets of pointers may be needed. For example, the "LBA0 " set of pointers are directed to the location of a first instance of volatile memory content, while the "LBA1" set of pointers are directed to the location of a second instance of volatile memory content, and so on and so forth.

Often, for debugging and logging purposes, it may be advantageous to store information related to the operation conditions of the iSC system. For example, the "Scatchpad0" and "Scatchpad1" data store information that may be used for firmware version control, debugging, and/or other purposes. Similarly, the "NV Debug" registers store debugging information, which can be used to change operation and behavior of the iSC system.

The controller module interfaces the volatile memory and controls its operations. To do so effectively, the controller module may rely on the specific characteristics, parameters (e.g., read and write speed, frequency, latency, etc.) and organization of the volatile memory. For example, even for the same models, each SDRAM memory chip may have different command, clock, and data delays to/from the controller module. In various embodiments, the controller module obtains performance information that is specific to the memory chip that it interfaces, and adjust its operations accordingly. For example, various parameters and characteristics are stored at "SDRAM control". Accordingly, training data registers "Context Training" store parameters of memory module at different contexts (e.g., different voltage level, frequency, etc.).

In various embodiments, contents are stored and/or updated at the metadata area of the non-volatile memory at the beginning of a SAVE or RESTORE execution as a baseline. It is then updated after the completion of the execution. This way the baseline status is retained even if a power failure occurs while an execution is in progress and the execution never completes. The baseline status for a SAVE or RESTORE operation is set to "Fail to Complete". It is updated to 'Complete Successfully" only after the operation is complete. This way there is no false positive if the operation was interrupted and never completed for any reason. It is to be appreciated that this operation prevents a false positive operation that can result in corrupted volatile memory image being restored and causing system crash.

Figure 3:
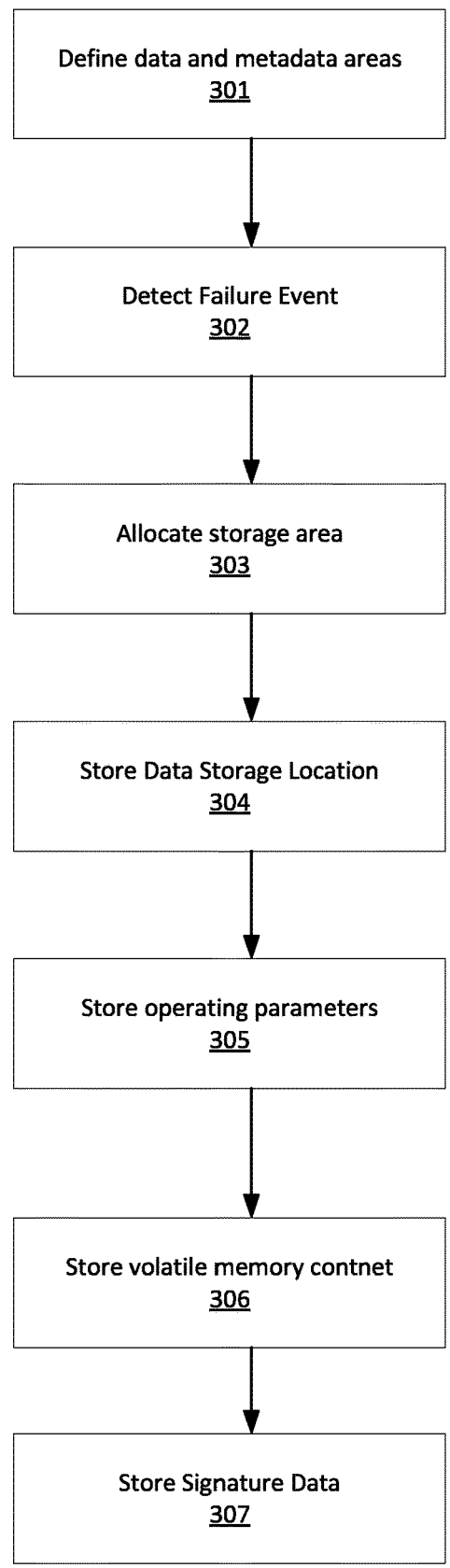
FIG. 3 is a simplified flow diagram illustrating a processing for saving volatile memory content according to an embodiment of the present invention.

FIG. 3 is a simplified flow diagram illustrating a processing for saving volatile memory content according to an embodiment of the present invention. This diagram is merely an example, which should not unduly limit the scope of the claims. One of ordinary skill in the art would recognize many variations, alternatives, and modifications. For example, various steps shown in FIG. 3 may be added, replaced, removed, modified, rearranged, and/or overlapped, which should not limit the scope of claims.

At step 301, a data area and a metadata area are defined on a non-volatile memory. For example, data area and the metadata area are illustrated in FIG. 2. It is to be appreciated that the non-volatile memory may have other area or region for storing other types of data. In certain embodiments, the data area is capable of storing more than one image data of the volatile memory.

At step 302, a failure event is detected. For example, the failure event can be power failure, system failure, power off operation, or other events. As explained above, the iSC system includes a backup power module that powers the system for backup operations through the failure event. In a specific embodiment, the controller module senses a voltage drop, which is an indication of potential power failure, and the controller module initiates the backup process.

At step 303, at least a portion of the data area for storing a content of a volatile memory is allocated. The controller module determines which area of the data area is to be used for storing content of the volatile memory.

At step 304, the location of the portion of the data area is stored at the metadata area. For example, the control module stores the location of backup data using predefined pointer registers at the metadata area.

At step 305, operating parameters of the memory system are stored at the metadata area. The operating parameters comprises information related to characteristics of the volatile memory. For example, operating parameters are stored at predefined locations of the metadata area according to Table 1 above. The characteristics of the volatile memory may include information such as latencies, frequencies, organization, and others. For example, the operating parameters may be empirically determined by the controller module through operating the volatile memory.

At step 306, the content of the volatile memory is stored at the portion of the data area. For example, the content of the volatile memory may be stored in its entirety as an image of the volatile memory. In certain embodiments, only a portion of the volatile memory is stored.

At step 307, one or more signature data is stored at the metadata area. For example, the one or more signature data include one or more signature registers, such as "Signature Low" and "Signature High" registers listed in Table 1. For example, since the signature data is store after other storing process are performed, validity of the signature data implies validity of other contents stored earlier.

Figure 4:
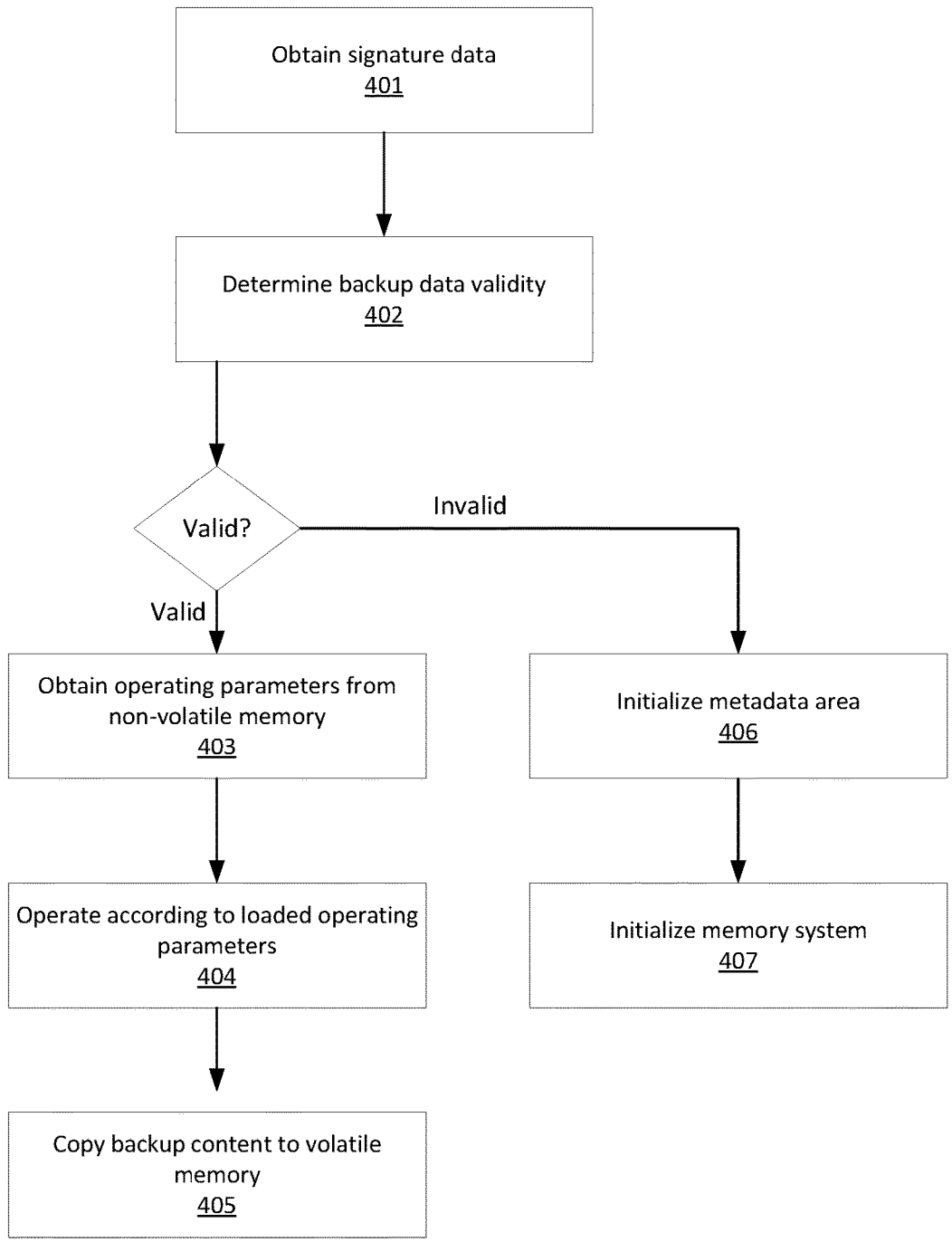
FIG. 4 is a simplified flow diagram illustrating a processing for restoring volatile memory content according to an embodiment of the present invention.

FIG. 4 is a simplified flow diagram illustrating a processing for restoring volatile memory content according to an embodiment of the present invention. This diagram is merely an example, which should not unduly limit the scope of the claims. One of ordinary skill in the art would recognize many variations, alternatives, and modifications. For example, various steps shown in FIG. 4 may be added, replaced, removed, modified, rearranged, and/or overlapped, which should not limit the scope of claims.

At step 401, the controller module interfaces the nonvolatile memory and obtains a signature data stored at a metadata area of a non-volatile memory. As described above, the non-volatile memory comprises the metadata area and a data area. The controller module uses the signature data to determine the validity of information stored both at the metadata area and the data area of the non-volatile memory.

At step 402, the validity of the previous data backup is determined. More specifically, the signature data is compared to a reference data. For example, the reference data is hardwired. If the signature data is the same as the reference data, the previous backup is valid. On the other hand, if the signature data is different from the reference data, the previous backup is invalid.

If the backup event is valid, a restore process is performed. At step 403, operating parameters are obtained from the metadata area of the non-volatile memory. The operating parameters include register and status information for operating the controller module and/or volatile memory parameters. The operating parameters allow the controller module and the non-volatile memory to operate in optimal condition.

At step 404, a controller module operates in accordance with the operating parameters. For example, during a restoring operation, the controller module resumes the operation of its FSMs by using the loading the register values and status information stored at the metadata area of the non-volatile memory. For example, the controller module rely on these operating parameters (e.g., speed, size, location, etc.) for copying backup data stored at the data area of the non-volatile memory to the volatile memory.

At step 405, a first content stored at the data area is copied to the volatile memory. In a specific embodiment, the nonvolatile memory stores more than one backup images of the volatile memory, and the controller module selects one of the backup images to be used. For example, the default operation may be to copy the latest backup image, but it may be desirable to use an earlier version if the latest backup image is corrupted or otherwise unusable.

Now referring back to step 402. If the backup event is invalid, the backup content stored at the nonvolatile memory is not to be used. At step 406, the metadata area is initialized using at least a predetermine set of parameters. Since operations are performed by the controller module, the controller module is initialized and operates from a default starting state. Accordingly, corresponding parameters are stored at the metadata area of the nonvolatile memory.

At step 407, the memory system is initialized. For example, a set of default parameters is used to operate the controller module and other component of the iSC system. For example, the set of default parameters include parameters for operating the controller module, volatile memory, non-volatile memory, interfacing the host controller, and/or other operations.

Figure 5:
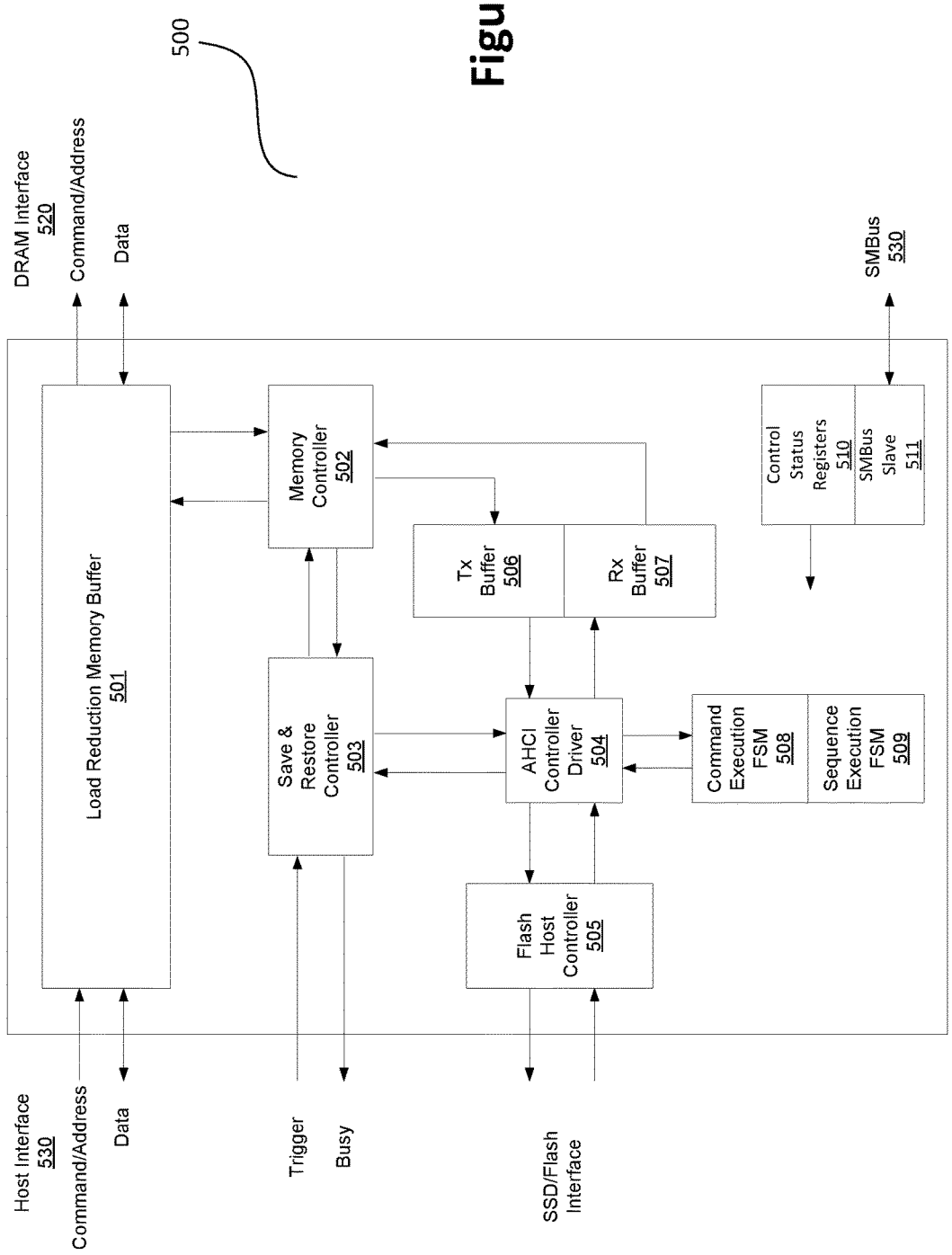
FIG. 5 is a simplified diagram illustrating a controller module 500 according to an embodiment of the present invention.

It is to be appreciated that the controller module for the memory system can be implemented in various ways. FIG. 5 is a simplified diagram illustrating a controller module 500 according to an embodiment of the present invention. This diagram is merely an example, which should not unduly limit the scope of the claims. One of ordinary skill in the art would recognize many variations, alternatives, and modifications. As an example, the memory controller module 500 uses a data path illustrated in FIG. 2 and can execute the processes illustrated in FIGS. 3 and 4.

The controller module 500 includes a buffer 501, which provides a data path and electrical buffer. As shown in FIG. 5, the buffer 501 comprises a load reduction memory buffer. For example, the buffer 501 is integrated as a part of the controller module chip. The buffer 501 is connected to the host interface 530 and the volatile memory (e.g., DRAM) interface 520. Through the buffer 501, data from a host system can be transmitted to the volatile memory. Additionally, the buffer 501 provides electrical buffer to reducing the loading power of on the I/O, thereby improving system efficiency and reliability.

The controller module 500 further includes a memory controller 502. It is to be appreciated the memory controller 502 is configured to operate when the host is not operating. For example, in normal operation mode, the host provides control functions for moving information back and forth between the host and the volatile memory; in failure mode (e.g., power down), the host is incapable of providing control functions, and the memory controller 502 takes over and provides control function for moving information (e.g., backing up information stored at the volatile memory to the non-volatile memory). In various implementations, the memory controller 502 is configured to operate at a high speed to quickly move data from the volatile memory to the non-volatile memory for backup. For example, in failure mode, the volatile memory has limited residual power (or back up power provide by a backup power module) for self-refresh and keep data alive, and the residual power of the volatile memory dictates the time window, during which the memory controller can back information stored at the volatile memory. For example, in failure mode, the memory controller 502 causes the data stored at the volatile memory to be transferred from the interface 520 to the non-volatile memory. In certain embodiments, the memory controller 502 can also reprogram the volatile memory. Additionally, the memory controller 502 may operate during normal operating mode for backing up data to the non-volatile storage.

The controller 503 provides save and restore functions. More specifically, the controller 503 is configured to receive indication of triggering event (e.g., power failure, power on, etc.). Among other features, the controller 503 facilitates and coordinates save and restore processes with other controllers of the controller module 500.

The controller 503 is connected to the driver 504. For example, the driver 504 comprises an advanced host controller interface (AHCI) driver, which provides interfacing with the host. For example, the driver 504 provide driving functions for the host controller. According to various implementations, the driver 504 receives commands from the FSMs (e.g., FSM 508 and FSM 509) to executable instructions for various controllers of the of the controller module 500. For example, the commands include command execution and sequence execution. It is to be appreciated the driver 504 may include other modules addition to or instead of the AHCI driver.

The driver 504 is connected to the controller 505. The controller 505 comprises a non-volatile memory (e.g., SSD/flash) interface. The controller 505 provides controller and I/O functions with the non-volatile memory. For example, during a SAVE event, the content of the volatile memory is copied to the non-volatile memory via the controller 505; during a RESTORE event, the content of the non-volatile memory is copied to the non-volatile memory, also via the controller 505.

The drive 504 is connected to the memory controller 502 via Tx buffer 506 and the Rx buffer 507. According to various embodiments, the Tx buffer 506 and the Rx buffer 507 are data buffers implemented using high speed volatile memory devices (e.g., SRAM). It is to be appreciated that the data buffers Tx buffer 506 and the Rx buffer 507 provide speed matching between the non-volatile memory and the volatile memory. For example, volatile memory typically operates much faster (e.g., 20 times or higher) than non-volatile memory. To transfer data between non-volatile memory and volatile memory, data are first buffer at the Tx buffer 506 and the Rx buffer 507 so that the non-volatile memory can transfer a block (instead of a stream) of data at a time. For example, the Tx buffer 506 and the Rx buffer 507 allow for data throttling and burst mode operation. The Tx buffer 506 and the Rx buffer 507 can be used to keep the non-volatile memory operating at a stable speed, while conserving power consumption for the volatile memory.

The controller module 500 additionally includes an SMBus 511. For example, the SMBus 511 is implemented as a serial bus operating in slave mode. Among other features, the SMBus 511 provide an interface for accessing the controller module 500, and can be used for program and updating various functions of the controller module 500.

The register block 510 comprises a number of registers, and is used by various controllers (e.g., controllers 503, 502, 505, etc.) and/or other components. For example, the registers are used to store various parameters and settings need for operating various controllers and components of the controller module 500. As an example, the register block 510 provides the function for the register module 224 is FIG. 2.

It is to be appreciated that the controller module 500 can be implemented in various ways, and FIG. 5 merely provides an simplified functional block diagram. Various components may be added, removed, replaced, or modified.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method comprising:
   detecting an occurrence of a failure event in an isolation storage controller system comprising a non-volatile memory and a volatile memory;
   in response to detecting the occurrence of the failure, allocating, by a memory controller, a first portion of a data area in the non-volatile memory for storing a content of the volatile memory;
   storing, in a metadata area of the non-volatile memory, an indication of a location of the first portion of the data area;
   storing, in the metadata area, operating parameters of the isolation storage controller system, the operating parameters comprising characteristics of the volatile memory at different contexts;
   storing, in the first portion of the data area, the content of the volatile memory; and
   storing, in the metadata area, signature data to validate the content of the volatile memory stored in the first portion of the data area.

2. The method of claim 1, further comprising:
   defining the data area and the metadata area in the non-volatile memory of the isolation storage controller system.

3. The method of claim 1, wherein detecting the occurrence of the failure event comprises detecting at least one of a power failure, a system failure, or a power-off operation.

4. The method of claim 1, further comprising:
   in response to detecting the occurrence of the failure, activating a backup power module in the isolation storage controller system.

5. The method of claim 1, wherein storing the indication of the location of the first portion of the data area comprises storing the indication of the location in a predefined pointer register in the metadata area.

6. The method of claim 1, wherein the characteristics of the volatile memory comprise at least one of latencies, frequencies, or organization of the volatile memory.

7. The method of claim 1, wherein storing the content of the volatile memory comprises storing an image of the volatile memory in the in the first portion of the data area.

8. A memory controller comprising:
   a finite state machine configured to:
   detect an occurrence of a failure event in a memory system managed by the memory controller;
   in response to detecting the occurrence of the failure, allocate a first portion of a data area in a non-volatile memory for storing a content of a volatile memory;
   store, in a metadata area of the non-volatile memory, an indication of a location of the first portion of the data area;
   store, in the metadata area, operating parameters of the memory system, the operating parameters comprising characteristics of the volatile memory at different contexts;
   store, in the first portion of the data area, the content of the volatile memory; and
   store, in the metadata area, signature data to validate the content of the volatile memory stored in the first portion of the data area.

9. The memory controller of claim 8, wherein the finite state machine is further configured to:
   define the data area and the metadata area in the non-volatile memory of the memory system.

10. The memory controller of claim 8, wherein to detect the occurrence of the failure event, the finite state machine to detect at least one of a power failure, a system failure, or a power-off operation.

11. The memory controller of claim 8, wherein the finite state machine is further configured to:
    in response to detecting the occurrence of the failure, activate a backup power module in the memory system.

12. The memory controller of claim 8, wherein to store the indication of the location of the first portion of the data area, the finite state machine is configured to store the indication of the location in a predefined pointer register in the metadata area.

13. The memory controller of claim 8, wherein the characteristics of the volatile memory comprise at least one of latencies, frequencies, or organization of the volatile memory.

14. The memory controller of claim 8, wherein to store the content of the volatile memory, the finite state machine is configured to store an image of the volatile memory in the first portion of the data area.

15. A method comprising:
    detecting, by a memory controller, an occurrence of a failure event in a memory system comprising a non-volatile memory and a volatile memory;
    in response to detecting the occurrence of the failure, activating a backup power module in the memory system, the backup power module to provide power for execution of a backup process comprising:
    allocating a first portion of a data area in the non-volatile memory for storing a content of the volatile memory;
    storing, in a metadata area of the non-volatile memory, an indication of a location of the first portion of the data area and one or more operating characteristics of the memory system at different contexts;
    storing, in the first portion of the data area, the content of the volatile memory; and
    storing, in the metadata area, signature data to validate the content of the volatile memory stored in the first portion of the data area.

16. The method of claim 15, further comprising:
    defining the data area and the metadata area in the non-volatile memory of the memory system.

17. The method of claim 15, wherein detecting the occurrence of the failure event comprises detecting at least one of a power failure, a system failure, or a power-off operation.

18. The method of claim 15, wherein storing the indication of the location of the first portion of the data area comprises storing the indication of the location in a predefined pointer register in the metadata area.

19. The method of claim 15, wherein the operating characteristics of the memory system comprise at least one of latencies, frequencies, or organization of the volatile memory.

20. The method of claim 15, wherein storing the content of the volatile memory comprises storing an image of the volatile memory in the in the first portion of the data area.

* * * * *

UNITED STATES PATENT AND TRADEMARK OFFICE
CERTIFICATE OF CORRECTION

PATENT NO. : 10,102,081 B2
APPLICATION NO. : 15/401985
DATED : October 16, 2018
INVENTOR(S) : Shih-ho Wu and Christopher Haywood Page 1 of 1

It is certified that error appears in the above-identified patent and that said Letters Patent is hereby corrected as shown below:

In the Claims

Claim 7,   Column 13,   Line 49,   please delete the first occurrence of "in the"

Claim 20,  Column 14,   Line 63,   please delete the first occurrence of "in the"

Signed and Sealed this
Nineteenth Day of March, 2019

Andrei Iancu
*Director of the United States Patent and Trademark Office*